United States Patent [19]
Curry et al.

[11] Patent Number: 6,032,248
[45] Date of Patent: Feb. 29, 2000

[54] MICROCONTROLLER INCLUDING A SINGLE MEMORY MODULE HAVING A DATA MEMORY SECTOR AND A CODE MEMORY SECTOR AND SUPPORTING SIMULTANEOUS READ/WRITE ACCESS TO BOTH SECTORS

[75] Inventors: Duncan Curry, Sunnyvale; Arthur Y. Yu, San Jose; Tsung D. Mok, Cupertino, all of Calif.

[73] Assignee: Atmel Corporation, San Jose, Calif.

[21] Appl. No.: 09/069,884

[22] Filed: Apr. 29, 1998

[51] Int. Cl.[7] .................................................. G06F 9/00
[52] U.S. Cl. ............................................... 712/37; 712/248
[58] Field of Search ................................ 712/37, 248, 32

[56] References Cited

U.S. PATENT DOCUMENTS

| | | | |
|---|---|---|---|
| 3,972,024 | 7/1976 | Schroeder et al. | 340/172.5 |
| 4,349,870 | 9/1982 | Shaw et al. | 364/200 |
| 4,780,814 | 10/1988 | Hayek | 364/200 |
| 4,782,439 | 11/1988 | Borkar et al. | 364/200 |
| 5,371,860 | 12/1994 | Neyagawa et al. | 395/325 |
| 5,375,083 | 12/1994 | Yamaguchi | 365/63 |
| 5,493,534 | 2/1996 | Mok | 365/226 |
| 5,537,601 | 7/1996 | Kimura et al. | 395/800 |
| 5,553,255 | 9/1996 | Jain et al. | 395/375 |
| 5,826,093 | 10/1998 | Assouad et al. | 395/800 |
| 5,968,161 | 10/1999 | Southgate | 712/37 |

*Primary Examiner*—David Y. Eng
*Attorney, Agent, or Firm*—Thomas Schneck; Rosalio Haro

[57] ABSTRACT

A microcontroller having a special function register to internally select between internal memory and external memory on the fly. Two data pointers in conjunction with the special function register result in four effective quick reference locations. The internal memory consists of one memory module having its array subdivided into a data memory store and a code memory store, and having a bank of pass devices to selectively isolate the code memory store from the data memory store. The present memory can further support concurrent writing to the data memory store while reading from the code memory store. This is done through one of two memory embodiments. In a first memory embodiment two y-decoders are used; a first y-decoder adjacent the code memory store and a second y-decoder adjacent the data memory store. When a simultaneous read/write instruction is started, the outputs from the second y-decoder and an x-decoder are latched. The latches maintain active the selected memory location within the data memory store while the bank of pass devices isolate it from the code memory stored. In a second embodiment, the second y-decoder is replaced with a high voltage page. The high voltage page supplies program and erase voltages directly to the data memory store and indirectly through the bank of pass devices to the code memory store.

48 Claims, 7 Drawing Sheets

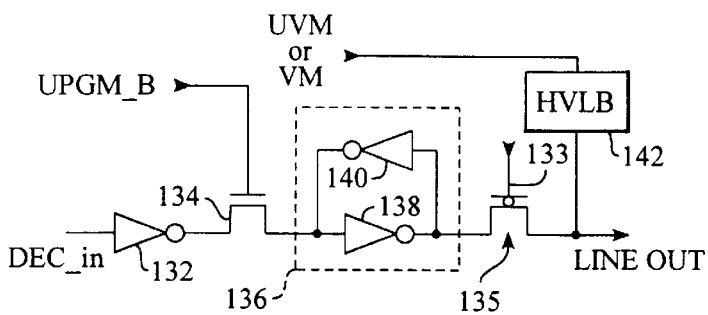
FIG. 5
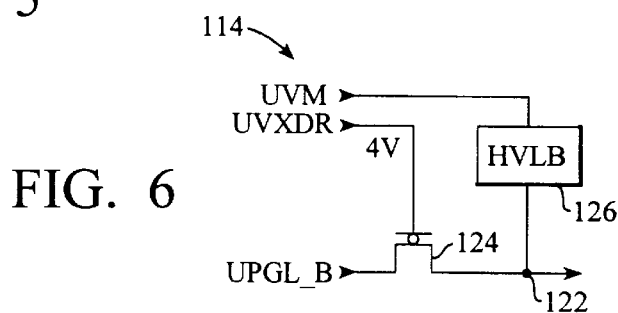
FIG. 6
FIG. 7
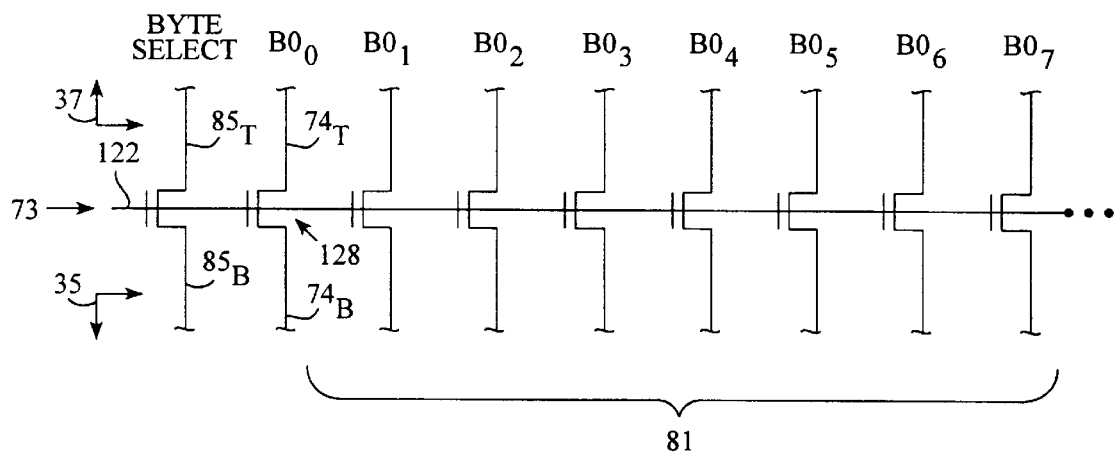
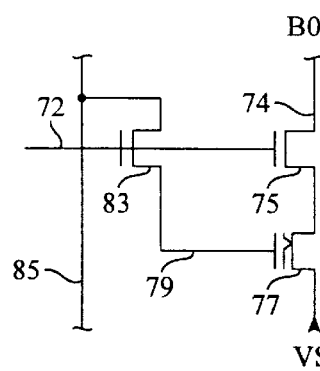
FIG. 8

MICROCONTROLLER INCLUDING A SINGLE MEMORY MODULE HAVING A DATA MEMORY SECTOR AND A CODE MEMORY SECTOR AND SUPPORTING SIMULTANEOUS READ/WRITE ACCESS TO BOTH SECTORS

TECHNICAL FIELD

The invention relates to a non-volatile code and data memory module combined with a microcontroller in a single IC chip.

BACKGROUND ART

Microcontrollers are single chip devices used to monitor and control the response of an apparatus to its surroundings. For example, they can be used to interpret user input keystrokes on a microwave oven and then control the microwave oven's response. Often, microcontrollers are designed to respond to multiple interrupts, such as an emergency shut off the microwave oven in response to someone opening its door. Microcontrollers traditionally are specialized for single bit manipulation and include a CPU, RAM, ROM, serial interfaces, parallel interfaces, timers, and interrupt scheduling circuitry.

There are several types of microcontrollers, but a popular family of 8-bit microcontrollers is based on the 8051 microcontroller architecture first introduced by Intel Corp. in 1981. This architecture traditionally used a ROM to hold program, or code, memory to control its operation. In essence, the code memory holds a list of instructions which tell the microcontroller how to respond to various stimuli. A separate memory, typically a RAM, holds data entries, i.e. intermediate results as well as temporary data constants. Since the program memory was stored in a ROM, it could not be changed and the microcontroller itself had to be replaced if the code program had to be updated. This made the prospect of introducing a new instruction program, i.e. code, to microcontrollers in the field very labor intensive.

Later, the code ROM was replaced with an EPROM, which permitted the altering of the instruction program without having to discard the microcontroller. EPROMs can be erased by subjecting them to ultraviolet light for several minutes, and they can then be re-programmed by means of an EPROM programming apparatus. This allowed engineers to test various instruction programs before sending the end-product microcontroller to the field. Once in the field, however, the labor costs associated with physically removing the microcontroller from the field, subjecting it to ultraviolet light for erasure and applying it to an EPROM programmer to update its instruction program, still made updates to microcontroller's program memory prohibitive.

Further improvements to the basic 8051 microcontroller architecture were disclosed in U.S. Pat. No. 4,782,439 to Borkar et al., relating to improved memory access, and in U.S. Pat. No. 4,780,814 to Hayek, which disclosed a communication interface. Although neither of these patents addressed the inflexibility of the 8051's code memory, this was not considered a problem since changes to the code memory of a microcontroller were traditionally rare. This situation changed, however, when microcontrollers were applied to more recent versatile applications such as cellular telephones and cable reception boxes.

A major improvement directed toward improving the flexibility of the 8051 architecture was disclosed in U.S. Pat. No. 5,493,534 assigned to the same assignee as the present invention. U.S. Pat. No. 5,493,534 introduced the use of a type of FLASH memory to hold program memory. Additionally, U.S. Pat. No. 5,493,534 introduced a voltage pump into the 8051 architecture which allowed the microcontroller to generate all erasing and programming voltages internally without the need of an EPROM or EEPROM programmer. By making a communication link with a PC board on which the microcontroller resided in the field, one could remotely update the microcontroller's program memory. Thus, it was no longer necessary to remove the microcontroller from the field when the program memory needed to be updated.

The recent use of microcontrollers in these more versatile applications has also necessitated the use of user specific data such as registration numbers, access codes, etc. This type of data is liable to change somewhat frequently and needs to be retained even after power is removed from the microcontroller. Since the traditional 8051 architecture supports an instruction set directed toward manipulation of data memory only in a RAM, this type of more permanent data storage is typically stored in an external EEPROM chip configured to respond like a RAM memory to read and write requests from the 8051 microcontroller. The 8051's internal program memory, be it ROM, EPROM or FLASH, memory cannot be used for storing this type of long term user specific data for two reasons. First, all microcontrollers are designed to have only read access to their program -memory when they are in an active mode of operation. This is necessitated by the fact that since the microcontroller's ALU is controlled by instructions coming from the program memory, it cannot alter its program store while executing from it. Therefore, all microcontrollers must first be placed in an inactive, or reset, mode and externally controlled in order to have their internal program memory altered. Secondly, the ALU within the microcontroller needs to be able to constantly fetch its next instruction from the program memory even while writing updates to the data memory at the same time. This too necessitates the use of a second memory module for the data memory store.

U.S. Pat. No. 5,375,083 discloses an IC card microcomputer incorporating a ROM module for storing program memory, a RAM module for storing temporary data memory and an EEPROM module for storing long term data memory. But, as stated above, the 8051 architecture has an instruction set which does not support manipulation of an internal EEPROM data memory store, and the 083' patent is therefore directed towards a microcontroller having an architecture and instruction set incompatible with that of the 8051 microcontroller family. This limits its application. The 083' patent also expounds on some of the difficulties of incorporating a separate EEPROM data memory module in addition to the ROM program, or code, memory module into the IC card.

As stated above, a main reason why two separate code and data memory modules are necessary is that the CPU within the microcontroller needs to be constantly fetching new instructions from the code memory even while it is writing updates to the data memory. Thus, incorporation of a nonvolatile data memory store into a microcontroller makes inefficient use of available memory space since it cannot access existing nonvolatile memory, and further complicates its design and layout by requiring an additional memory module, such as an EEPROM module, added to the microcontroller.

Still another limitation of microcontrollers is their limited amount of addressable program and data space, which is typically limited to a 16 bit address register. This is especially true of the 8051 family of microcontrollers. The 8051 is capable of internally addressing up to $2^{16}$, or 64K, program memory locations, but this much program memory is typically not located internal to the microcontroller. Therefore, an External Access, EA, pin permits the 8051 to access program memory external to itself. For example, if the microcontroller has no internal program memory, then the EA pin is external tied low and all program fetch instructions are directed toward program memory external to the microcontroller. If the 8051 does have some internal program memory, then the EA pin is tied high and program fetch instructions which lie within the microcontroller's internal memory are accessed internally, and fetch instructions lying outside the available internal memory are automatically directed toward external memory. In either case, the microcontroller cannot access more memory than is available with 16 address bits, i.e. 64K.

The case of data memory is even more restrictive. The 8051 internal architecture has an 8-bit, or 256, address capacity for internal data access, although this amount can be slightly extended by using indirect addressing. In order to access its full 64K of data memory space, one needs to use a MOVX instruction, which utilizes a 16-bit address register and accesses only external data memory. This has traditionally not been a problem since data memory had been limited to RAM, which holds only temporary data, has relatively large memory cells and has a quick access time to external memory.

What is needed is an 8-bit 8051 type microcontroller with more efficient and more flexible use of memory. It is an object of the present invention to provide a microcontroller which eliminates the need for two separate and independent code and data memory modules and thereby make more efficient use of available chip area.

It is another object of the present invention to provide a microcontroller whose addressable space is not limited by the size of its address register.

It is yet another object of the present invention to facilitate the construction of look-up tables in internal and external data memory space.

SUMMARY OF THE INVENTION

The above objects are achieved in a microcontroller which combines the attributes of FLASH and EEPROM memories in the construction of code and data memories. The code and data memories of the present invention separately function as either FLASH or EEPROM memory when in serial mode, and both function together as one contiguous FLASH memory when in parallel mode. To accomplish this, both the data and program memory requirements are combined into a single memory module having a single array divided into a code space and a data space. The code space has a first cycling rating and is designated for storing code memory, and the data space array has a second cycling rating at least 10 times larger than that of the code space and is designated for storing data memory. Although both code space and data space are part of a single memory module within the microcontroller and share the same address decoders, sense amps, output drivers etc., they support simultaneous reading of the code space while writing to the data space. Furthermore, since only one memory module is used instead of two, the memory capacity of the microcontroller can be increased with limited impact on the overall IC size.

Simultaneous reading of the code space while writing to the data space is accomplished by means of two optional memory architectures which divide a memory array into a first memory sector for storing code and a second memory sector for storing data. In both architectures, both memory sectors share a common set of bitlines, but a set of pass devices can optionally isolate the bitlines running through the code sector from the bitlines running through the data sector. Similarly, in both architectures the sense amps, y-decoders and drivers are placed in direct access to the code sector such that the code sector always has access to the sense amps, but the data sector can be optionally isolated from the sense amps by means of the set of pass devices. When the data sector is being programmed, the pass devices isolate the code sector read operations from the data sector while permitting the y-decoders, sense amps and output drivers to still have read access to the code sector.

The two architectures differ in the manner in which the program operation of the data sector is maintained active while the code sector continues to support read operations.

In a first embodiment, the data sector has a duplicate, second y-decoder adjacent to it. High programming and erasing voltages are transferred through this second y-decoder to the data sector and, when necessary, through the pass devices to the code sector. Transparent latches maintain the bitlines and wordlines active in the data sector during a program operation, while the first y-decoder and same x-decoder used by the data sector select a second pair of bitlines and wordlines in the code sector. The data sector is then programmed in an EEPROM manner, which is byte by byte.

In a second embodiment, the duplicate y-decoder is replaced with a bitline high voltage page. Data which is going to be programmed into either the code sector or the data sector is first stored in the high voltage page. The high voltage page has a signal flag indicating which bytes within the page are to be programmed and which are not. Only those bytes which are designated for program operations undergo an erase cycle. Again, a set of pass devices isolates the data sector from the code sector during simultaneous read/write operations. Thus, both the data sector and the code sector can be altered byte by byte as if they were two separate EEPROM memories. Both, however, also support a flash erase operation during which the y-select lines of all bytes in both data and code sectors are selected and thus all bytes in both arrays are simultaneously erased.

The present invention further includes a mechanism by which the microcontroller itself can dictate whether it will access internal data memory or external data memory on the fly. A new special function register contains, among other things, a memory access flag which is set for access to internal memory and reset for access to external memory. Thus the effective addressable data memory space of the microcontroller is doubled. That is, once the maximum addressable internal data memory is reached, the special function register can then be set to access an equal amount of external data memory. Since this is an internal register, the program memory itself can dictate whether the flag is set or not set and thus convert from internal access to external access.

BRIEF DESCRIPTION OF THE DRAWINGS

FIG. 5 is a circuit implementation of a transparent latch in accord with the present invention.

FIG. 6 is an internal structure of the pass bank control circuit of FIG. 4 in accord with the present invention.

FIG. 7 is an internal structure of the pass device bank of FIGS. 3 and 4 in accord with the present invention.

FIG. 8 is a closeup view of a section of the array structure of FIG. 3.

BEST MODE FOR CARRYING OUT THE INVENTION

Figure 1:
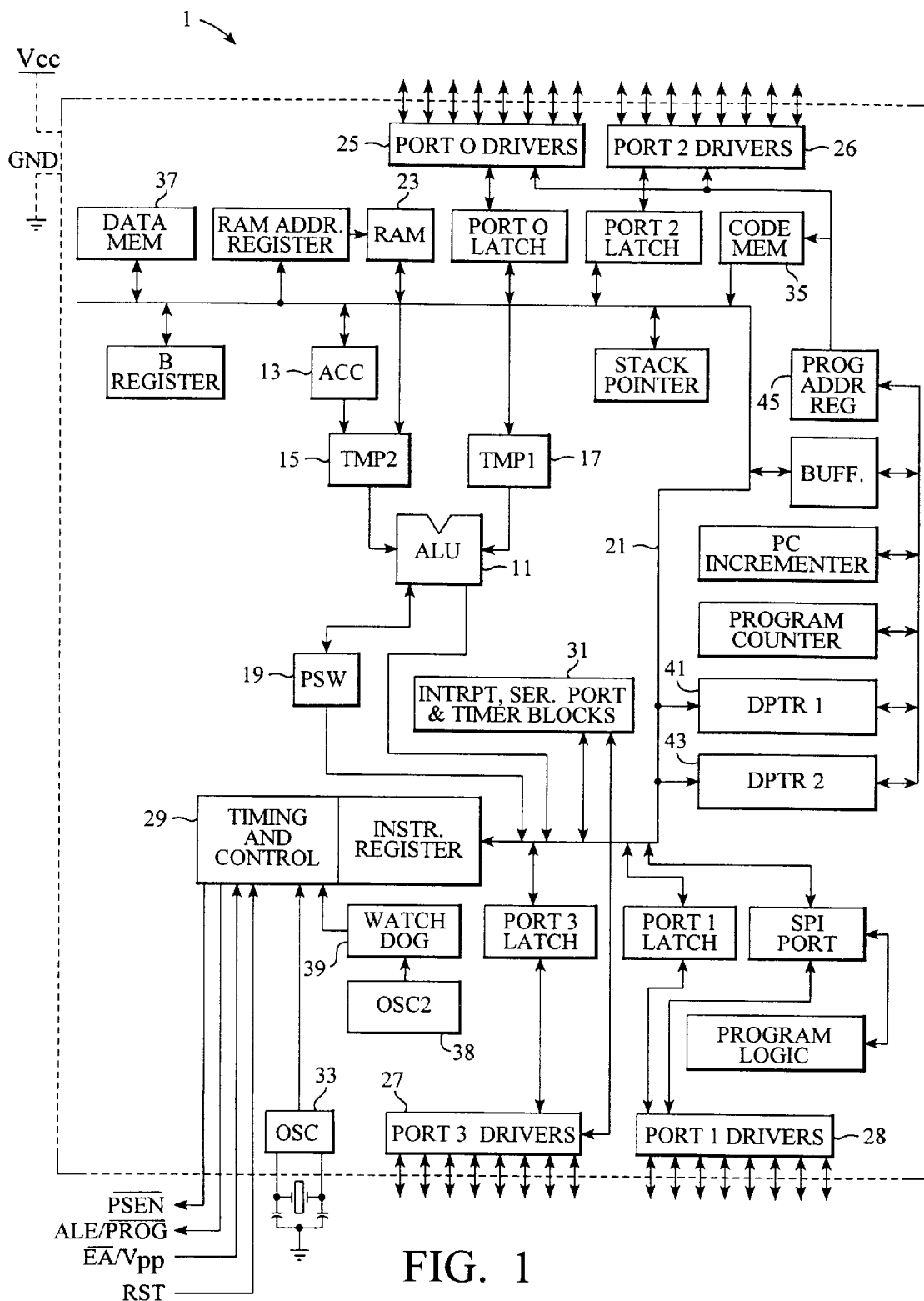
FIG. 1 is an overall block architecture of a microcontroller in accord with the present invention.

With reference to FIG. 1, the general architecture of a microcontroller in accord with the present invention is shown. Microcontroller 1 includes a central processing unit, CPU, consisting of an arithmetic logic unit ALU 11 which is fed by an accumulator 13 via a first temporary register 15. ALU 11 is also responsive to a second temporary register 17. The results of ALU 11 are transferred onto a local bus 21 and onto a program status word 19, which holds any special status features of the calculation just performed. Microcontroller 1 further includes 256 bytes of RAM 23 which incorporate all special function registers, 32 I/O lines 25–28, three 16 bit timers and counters 29, a multilevel interrupt architecture 31, on-chip oscillator 33 and clock circuitry. All of the previously discussed elements are generally known in the art of microcontrollers and are more fully disclosed in U.S. Pat. No. 5,493,534 assigned to the same assignee as the present invention and in U.S. Pat. No. 4,780,814 to Hayek.

More characteristic to the present invention are data memory 37 and program, or code, memory 35, which although shown as separately in FIG. 1 are actually part of a single memory module to be explained later. The present invention further includes a programmable watchdog timer 39 as well as first 41 and second 43 data pointer banks. Control signals PSEN, ALE/PROG, EA/Vpp, and RST perform various reset and memory management routines and also facilitate programming protocols as disclosed in U.S. Pat. No. 5,493,534.

The presently preferred embodiment incorporates 8 kilobytes of internal code memory 35 and 2 kilobytes of internal data memory 37. Prior art 8051 microcontrollers were limited to a smaller amount of internal data memory due to only 8 address bits being available for internal data access. The architecture of the prior art 8051 family used both direct and indirect addressing to access the lower 128 locations of internal data memory and used indirect addressing to access the upper 128 locations. Direct addressing of the upper 128 locations is reserved for accessing special function registers within the microcontroller. In order to access more data memory, prior art 8051 architecture required indirect addressing of external data memory through a "Move External" command, MOVX, which uses a 16 bit data pointer to address up to 64K of external data memory.

The present embodiment does not deviate from the standard instruction set of the 8051 family and maintains the use of 256 bytes of RAM memory and a bank of special function registers. Like in the prior art, the present embodiment also supports both direct and indirect addressing of the lower 128 bytes of RAM and indirect addressing of the upper 128 bytes of RAM. Similarly, direct address of the upper 128 locations is reserved for access to the special function registers.

This poses a problem to the present application since to gain access to the 2K of additional internal data memory, one needs a 2 byte address, but the 8051 architecture only supports 1 byte addressing of internal data memory. In order to not deviate from basic 8051 instruction set and to not alter the basic addressing schemes of prior art 8051 architecture, the present invention extends the use of the existing MOVX instruction, which already supports 2 byte addressing for manipulation of data memory, to access both internal and external data memory. Therefore, all accesses to internal data memory 37 are accomplished with indirect addressing by means of the MOVX command along with program address register 45 and a special flag bit which distinguishes between internal and external data memory accesses, as more fully explained below. The use of this special flag bit effectively doubles the amount of available data memory since the MOVX command can be used to access up to 64K of internal data memory and then to access up to 64K of additional external data memory. All other internal data memory accesses are directed to RAM 23 and to the status registers.

Since the prior art 8051 architecture already supports addressing of up to 64K of code memory 35, internal or external, no new addressing scheme was needed for this feature of the present embodiment. In the prior art, part of the 64K of code memory may be internal to the microcontroller and the rest may be external to the microcontroller. In this prior art approach, the microcontroller monitors its program counter, which points to the next executable instruction. If the next executable instruction lies within the address space of the internal code memory, then the program counter is applied to the internal code memory. If the next instruction is outside the address space of the internal code memory, then the program counter is applied to the external code memory up to a maximum addressable space of 64K.

However, in an alternate embodiment of the present invention, the amount of addressable code memory may be extended beyond 64K by means of an additional flag bit similar to the special flag bit discussed above to distinguish between accesses of internal and external data memory. But this additional flag bit to control code memory would cause slightly different behavior. For example, when this additional flag bit is reset, the microcontroller would function as in the prior art. That is, if the EA pin were tied high, then the microcontroller would access all the available internal code memory, and if the internal code memory is less than 64K then it would automatically switch to external code memory at the next address up to a maximum of 64K.

Under this approach if all 64K of code memory were internal to the microcontroller then no additional external code memory may be accessed. Similarly, if less than 64K of code memory is internal to the microcontroller, when external code memory is automatically accessed, it starts at the next available address such that no more than 64K of internal and external locations may be addressed. For example, if 16K of internal code memory were available then only 48K of additional external memory may be addressed.

In this alternate embodiment, however, if the additional flag bit were set, then the microcontroller would access external code memory at the next address even if the next address were also available in internal code memory. In this manner, if 64K of code memory is internal to the microcontroller, then by setting this additional flag bit an additional 64K of external code memory could be accessed. The amount of addressable code memory would also be extended even if less then 64K of code memory were internal to the microcontroller. If, for example, the microcontroller had 16K of internal code memory and the microcontroller had 64K of external code memory, then after the initial internal 16K of internal code memory and the subsequent upper 48K of external memory had been accessed, the additional flag bit could be set and thereby gain access to the additional lower 16K of external code memory.

Further augmenting the present embodiment is a new special function register called the Watchdog and Memory Control Register, or WMCON register, used to distinguish not only between internal and external data memory accesses but also for controlling watchdog timer 39. WMCON register is shown below along with the meaning of each of its control flag bits.

| WMCON Address = 96H | | | | | | Reset Value = 0000 0000B | |
|---|---|---|---|---|---|---|---|
| | PS2 | PS1 | PS0 | EEMWE | EEMEN | DPS | WDTRST | WDTEN |
| Bit | 7 | 6 | 5 | 4 | 3 | 2 | 1 | 0 |

| Symbol | Function |
|---|---|
| PS2 PS1 PS0 | Prescaler Bits for the Watchdog Timer. When all three bits are set to '0', the watchdog timer has a nominal period of 16 ms. When all three bits are set to '1', the nominal period is 2048 ms. |
| EEMWE | EEPROM Data Memory Write Enable Bit. Set this bit to '1' before initiating byte write to on-chip EEPROM with the MOVX instruction. User software should set this bit to '0' after EEPROM write is completed. |
| EEMEN | Internal EEPROM Access Enable. When EEMEN = 1, the MOVX instruction with DPTR will access on-chip EEPROM instead of external data memory. When EEMEN = 0, MOVX with DPTR accesses external data memory. |
| DPS | Data Pointer Register Select. DPS = 0 selects the first bank of Data Pointer Register, DP0, and DPS = 1 selects the second bank, DP1. |
| WDTRST RDY/$\overline{BSY}$ | Watchdog Timer Reset and EEPROM Ready/$\overline{Busy}$ Flag. Each time this bit is set to '1' by user software, a pulse is generated to reset the watchdog timer. The WDTRST bit is then automatically reset to '0' in the next instruction cycle. The WDTRST bit is Write-Only. This bit also serves as the RDY/$\overline{BSY}$ flag in a Read-Only mode during EEPROM write. RDY/$\overline{BSY}$ = 1 means that the EEPROM is ready to be programmed. While programming operations are being executed, the RDY/$\overline{BSY}$ bit equals '0' and is automatically reset to '1' when programming is completed. |
| WDTEN | Watchdog Timer Enable Bit. WDTEN = 1 enables the watchdog timer and WDTEN = 0 disables the watchdog timer. |

The WMCON register contains three Scalar bits PS0–PS2 to control watchdog timer 39 in accordance with a preferred relationship shown in the table below.

| Watchdog Timer Period Selection | | | |
|---|---|---|---|
| WDT Prescaler Bits | | | Period |
| PS2 | PS1 | PS0 | (nominal) |
| 0 | 0 | 0 | 16 ms |
| 0 | 0 | 1 | 32 ms |
| 0 | 1 | 0 | 64 ms |
| 0 | 1 | 1 | 128 ms |
| 1 | 0 | 0 | 256 ms |
| 1 | 0 | 1 | 512 ms |
| 1 | 1 | 0 | 1024 ms |
| 1 | 1 | 1 | 2048 ms |

Watchdog timer 39 operates from a second independent oscillator 38 with scaler bits PS0–PS2 in special function register WMCON used to set the period of watchdog timer 39 from 60 ms to 2048 ms. The purpose of watchdog timer is to prevent microcontroller 1 from accidentally locking up. The watchdog timer is reset by setting the WDTRST bit in Special Function resistor WMCON before the preselected time period has elapsed. If the watchdog timer's preselected time period elapses without bit WDTRST being reset or disabled, an internal reset pulse is generated which resets microcontroller and thus prevents any lockup conditions.

Bits EEMWE and EEMEN in special function register WMCON direct the MOVX command to access internal data memory instead of external data memory. Although internal data memory can function as either a full function EEPROM writing one memory location at a time or function as a Flash memory erasing and write one block of memory locations at a time, these two control bits make reference to the data memory's EEPROM behavior since it is more likely to function in this capacity when it is being accessed by the microcontroller's internal CPU. Bit EEMWE functions as a read/write signal to internal data memory 37. Bit EEMWE should be set to a logic 1 prior to initiating a write sequence to internal data memory 37, and should be reset to a logic 0 at the end to the write sequence. Bit EEMEN differentiates between internal and external data memory accesses. If bit EEMEN is set to a logic 1, then the MOVX commend will be directed to internal data memory 37, but if bit EEMEN is reset to a logic 0, then the MOVX command will be directed to external data memory.

Bit DPS within special function Register WMCON is a data pointer register select bit used to select one of the two data pointer banks 41 or 43. Each data pointer bank can be used in indirect addressing of data memory such as used in reading look-up data tables. Use of two data pointer banks facilitates the accessing of multiple tables since the current contents of a data pointer do not need to be pushed onto a stack prior to switching to another table.

Data pointer select flag bit DPS can be used in conjunction with control bit EEMEN, which is used to distinguish between accesses to internal and external data memory. When EEMEN is set to 1, the MOVX function will access internal data memory at a location noted by a selected one of data pointer 41 or 43. When EEMEN is set to 0, the MOVX function will access external data memory at a location again noted by a selected one of data pointer 41 or 43. Thus, by appropriate programming and making certain that two pairs of tables are located at the same address locations in both internal and external data memory, the combination of the dual data pointers 41 and 43 along with control signal EEMEN effectively doubles the number of data pointers since one can use the data pointers to access two locations within internal data memory and then access two different locations having the same addresses in external data memory.

These features of the present microcontroller are further enhanced by its memory architecture which reduces memory area while increasing memory capacity and flexibility.

Figure 2:
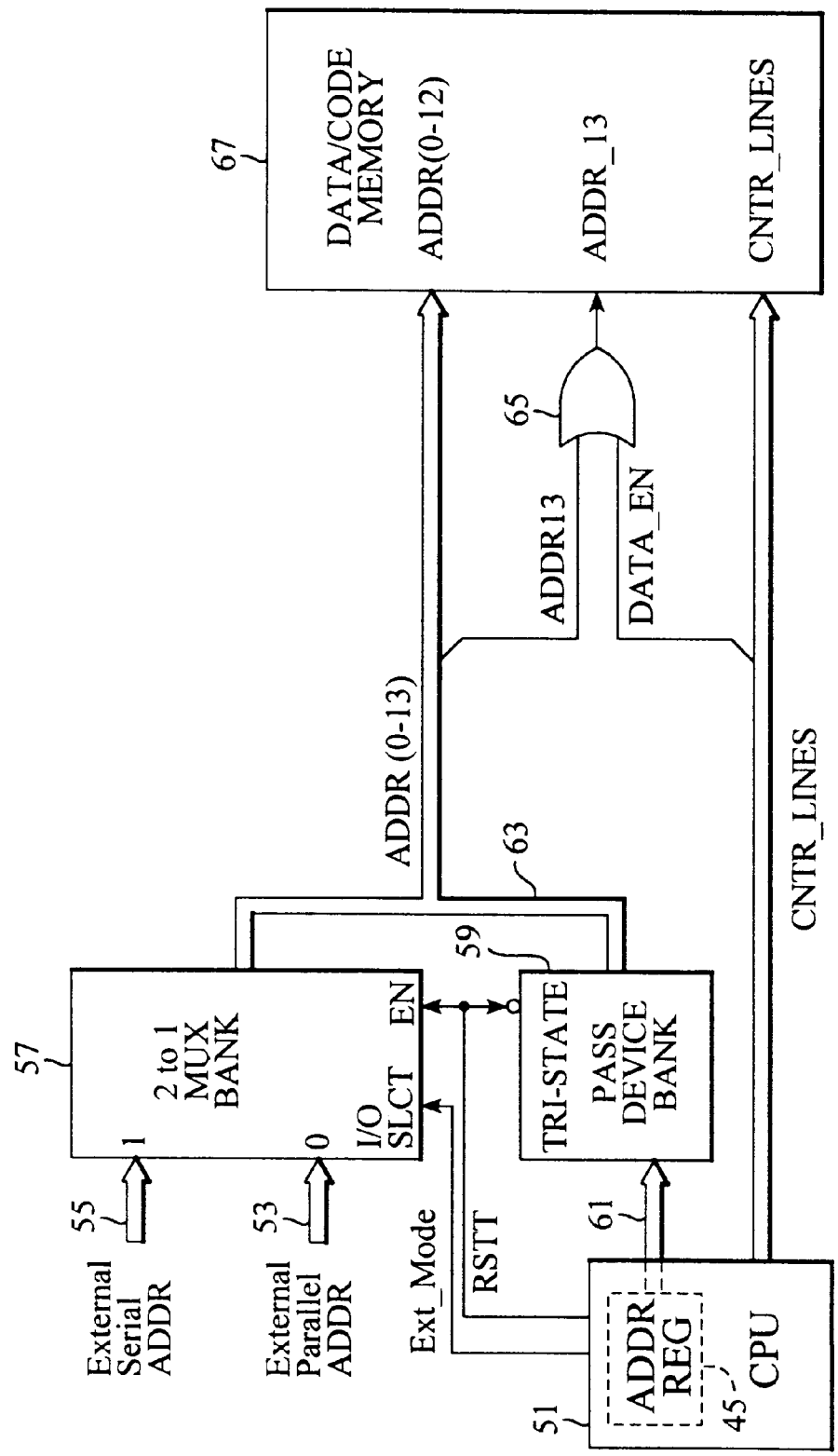
FIG. 2 is a block diagram of how an external serial means, an external parallel means and an internal CPU gain access to the memory module of the present invention.

With reference to FIG. 2, the constituent parts of the CPU described with respect to in FIG. 1 are collectively shown as block 51. As stated earlier, data memory 37 and code memory 35 of FIG. 1 are in actuality one continuous array in a single memory module shown in FIG. 2 as data/code memory 67. Data/code memory 67 may be accessed internally by CPU 51 or accessed externally through either external serial means 55 or external parallel means 53. External serial means 55 and external parallel means 53 preferably form part of the configurable serial and parallel ports 25–28 shown in FIG. 1.

Data/code memory 67 looks and functions differently from a user's perspective depending on whether it is being accessed in parallel or in serial mode. In parallel mode, internal data memory 37 and internal code memory 35 function as one continuous memory array comprising a single memory space with no distinction between data or code memory space. For example, in the presently preferred embodiment data/code memory 67 comprises 8K of code memory and 2k of data memory, but if data/code memory 67 were being accessed in parallel mode then it would behave like a single 10K memory array with code space preferably spanning addresses 0 to 8K and data space spanning address 8K+1 to 10K. Furthermore, in parallel mode data/code memory 67 functions like a single flash module. That is, the entire contents of both code and data space are erased simultaneously and the entire array may then be reprogrammed one byte at a time. Also, in parallel mode, the microcontroller requires the application of a high programming and erasing voltage Vpp and is compatible with existing FLASH or EPROM programmers.

In serial mode, however, data/code memory 67 functions as either two separate flash modules or two separate EEPROM modules, each having a separate address space and each responding to separate programming and reading commands. One of the separate modules serves as an independent code memory occupying a contiguous address space preferably spanning from 0 to 8K, and the other serves as an independent data memory occupying a contiguous address space preferably spanning from 0 to 2K. In serial mode, data/code memory 67 internally generates all high voltages necessary for programming and erasing such that a separate Flash or EPROM programmer is not required, and both the data memory space and the code memory space may be remotely updated within a user's system in the field. In serial programming mode, data/code memory 67 supports an auto-erase cycle built into each self-timed byte programming operation, and thus behaves like an EEPROM memory. Alternatively, data/code memory 67 also supports a Chip Erase command which simultaneously erases the entire memory array and thereby functions as a flash memory. External serial means 55 preferably follows a standard Serial Peripheral Interface, SPI, when communicating with data/code memory 67.

Since the microcontroller's code memory may be serially updated in the field, a security programming fuse is incorporated into the preferred embodiment. When set, this programming fuse disables all serial programming of data/code memory 67. Secondly, programming fuse is not accessible in serial mode, and may be set or reset only in parallel mode. Since program and erase operations in parallel mode require a Flash or EPROM programmer, this assures that no tampering may occur while the microcontroller is within a user system in the field.

If data/code memory 67 is being accessed externally, either by serial address bus 55 or parallel address bus 53, then data/code memory 67 behaves as one continuous memory array consisting of the single memory space with no distinction between data or code memory space. Additionally, if data/code memory 67 is being accessed by a serial means 55 then data/code memory 67 behaves as an $E^2$ memory having byte programmability with an automatic byte erase. But if memory 67 is being accessed through parallel means 53, then it behaves as one continuous flash memory having flash array erase of its entire data space and code space contents simultaneously, and supports byte programmability. Additionally, if it is being accessed internally by CPU 51, then it behaves like two separate memory arrays having overlapping addresses.

CPU 51 has access to data/code memory 67 only when memory 67 is not being accessed externally by either serial means 55 or parallel means 53. If no external access is executing and CPU 51 is active, then signal RSTT has a logic low output applied to an active low input of a tristate pass device bank 59 and to an active high enable input of a 2-to-1 multiplexer bank 57. The outputs of both 2-to-1 MUX bank 57 and tristate pass device bank 59 are coupled together to form a single address bus 63 applied to data/code memory 67. With a logic low on signal RSTT, tristate pass device bank 59 passes the contents of address register 45 via bus 61 onto address bus 63 while 2-to-1 MUX bank 57 isolates address bus 63 from either of external input means 55 and 53. If an external access is initiated however, then signal RSTT will have a logic high causing tristate pass device bank 59 to isolate address bus 63 from bus 61. A logic high on RSTT further enables 2-to-1 MUX bank 57 which will transfer one of either external serial address means 55 or external parallel address means 53 onto address bus 63 as determined by External Mode signal Ext_mode coupled to a control input of MUX bank 57.

As stated earlier, data/code memory 67 will behave either as a continuous addressable single memory space when being accessed in external parallel mode, or as two separate memory spaces when being accessed internally by CPU 51 or externally in serial mode. To accommodate these two functions the data and code memory spaces within memory 67 are preferably separated by means of the more significant bits. In the present implementation, the data memory space is located in upper memory accessible by activation of most significant bit ADDR13, and code memory space is located in the lower memory. Thus, when data/code memory 67 is being read as one continuous memory array by external parallel means 53, then the data space will not be accessed until the more significant bit, i.e. ADDR13, is asserted. But when data code memory 67 is being accessed internally by CPU 51 or by external serial means 55 and the data and code memory spaces need to behave as two independent memory spaces, a data enable control signal, DATA_EN, is asserted when data space is to be accessed and is deasserted when code memory is to be accessed. The most significant bits which identify data space, i.e. ADDR13, and control signal DATA_EN are applied to OR gate 65 whose output is applied to the most significant address bit input ADDR_13 of data/code memory 67. Thus, when either the most significant address bit ADDR13 of address bus 63 is asserted or when signal DATA_EN is asserted, then data/code memory 67 will respond by accessing its data space.

Figure 3:
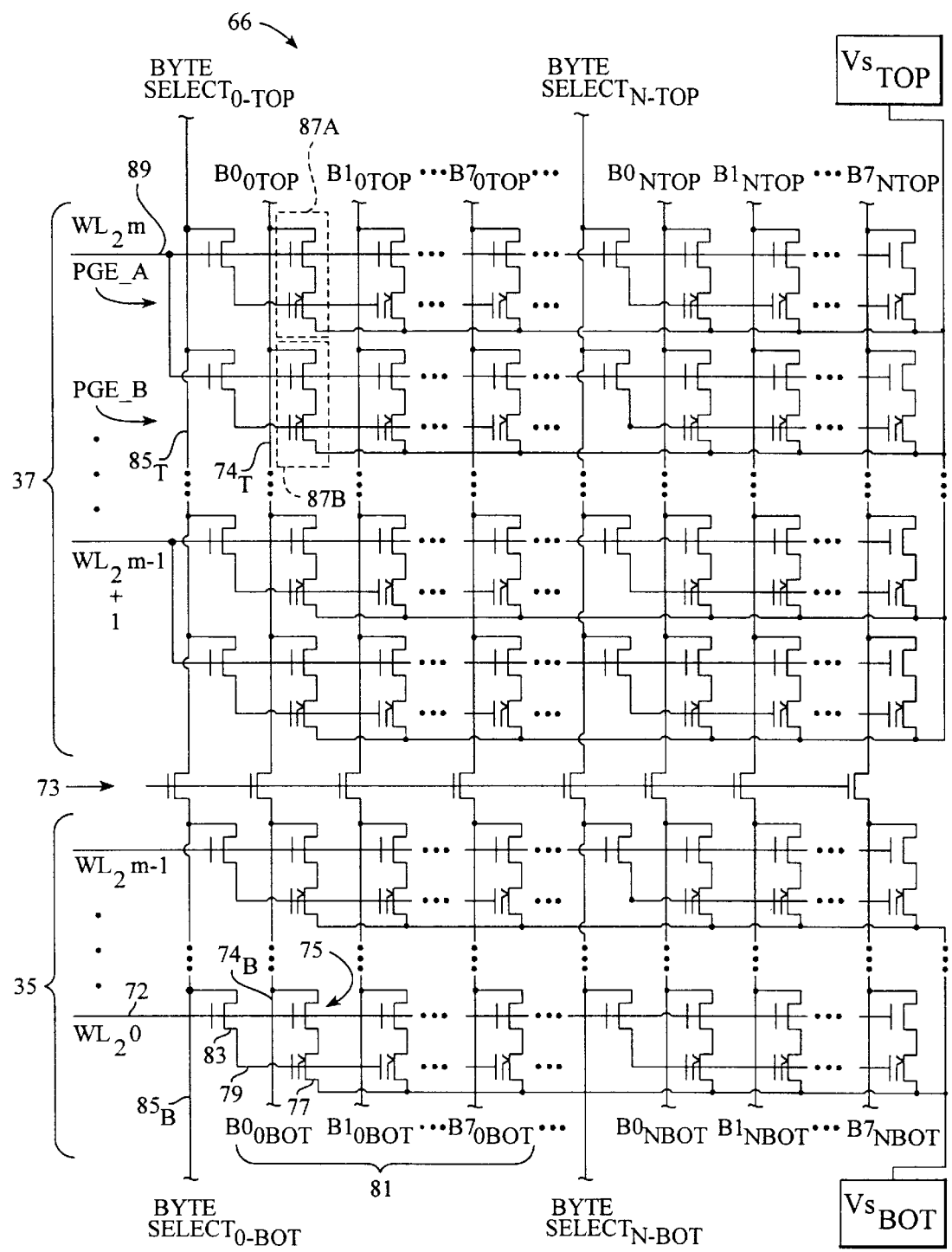
FIG. 3 is a partial layout of a memory cell array in accord with the present invention.

With reference to FIG. 3, an exemplary array layout 66 of data/code memory 67 is shown. Memory array 66 is divided into a code memory space 35 and a data memory space 37 by means of a bank of pass devices 73. As stated above, the preferred embodiment has data memory 37 in upper, or top, memory space and code memory 35 in lower, or bottom, memory space. Since many of the constituent elements of both code 35 and data 37 memory space are similar, they are identified by similar reference characters with the addition of a subscript "T" or "TOP" for elements within data memory space 37 and a subscript "B" or "BOT" for elements within code memory space 35. When a common reference character is used without a subscript qualifier, then the reference character is applicable to both code memory space 35 and data memory space 37. Code bitlines $74_B$ and code byte select lines $81_B$ are selectively coupled to or isolated from respective data bitlines $74_T$ and data byte select lines $81_T$ by means of the bank of pass devices 73.

Code space 35 follows a traditional EEPROM architectural layout. A row of memory cells is equivalent to a memory page in addressable space and is identified by a dedicated wordline 72 electrically coupled to the control gates of all cell select transistors 75 within one row. Each cell select transistor 75 together with a serially connected variable threshold transistor 77 constitutes one storage memory cell. When a wordline 72 is activated, a cell select transistor 75 electrically couples its serially connected variable threshold transistor 77 to its corresponding bitline 74, which is used to read information stored in the variable threshold transistor 77.

To support byte addressability, data is organized into eight bits B0 to B7, comprising one byte 81. A sense line 79, which applies reading, programming and erasing voltages to the control gate of a variable threshold transistor 77, is broken into segments coupling together the control gates of eight consecutive variable threshold transistors 77, or one byte 81. A byte select column line 85 and byte select transistor 83 are used to address each byte 81 of memory cells such that by means of the byte select column lines 85 and byte select transistors 83, only one sense line segment 79 and thereby only one byte 81 may be individually selected during programming, reading or erasing.

Data space 37 of array 66 has an arrangement similar to that of the code space 35 with the exception that data space 37 is designed to have a cycling rating at least ten times larger than that of the code space 35. In the present embodiment, data space 37 has a cycling rating of a hundred thousand cycles while code space 35 has a cycling rating of one thousand cycles. To establish differing cycling rating for selected memory cells throughout singular array 66, data space 37 is preferably given one hundred percent redundancy while code space 35 is given minimal, or no redundancy. That is, each storage cell 87A within data space 37 has a redundant cell 87B corresponding to itself. In the present embodiment, each wordline 89 in data space 37 controls a primary memory page PGE_A and a redundant memory page PGE_B, with all the memory cells 87A in PGE_A replicated as 87B in PGE_B. Redundant memory page PGE_B further receives the same bitlines $74_T$ and byte select lines $85_T$ as primary memory page PGE_A. In this manner, whenever a memory cell 87A in PGE_A is read, programmed or erased, the same operation is performed on its corresponding redundant cell 87B in PGE_B.

Normally, one can selectively put electrons onto a floating gate device 77 to raise its threshold voltage and impede current flow, or optionally pull electrons off its floating gate to lower its threshold voltage and facilitate current flow. A sense amp detects the current flow or lack of current flow through a memory cell and thereby identifies a stored logic 1 or logic 0. When a memory cell 87 fails, it is typically because it is no longer possible to pull electrons off its floating gate, causing it to retain a permanent high threshold level which prevents current from flowing through it. If a cell becomes damaged and one can no longer optionally remove charge off the floating gate, then one can no longer alter the flow of current through the memory cell and thus can no longer write new data into it. But in the present case, if a memory cell 87A in PGE_A gets stuck with a high threshold voltage, i.e. it no longer conducts current, then its corresponding redundant cell 87B in PGE_B, which is not damaged, can continue to be programmed, erased and read and thus no data is lost.

In the present embodiment, memory array 66 is divided into m rows of memory pages with n bytes in each memory page. As stated earlier, code space 35 and data space 37 are separated by appropriate selection of address bits. In the present embodiment, wordlines $WL_20$ through $WL_2m-1$ correspond to code space 35. Pass device bank 73 separates code space 35 from the data space 37, which begins with wordline $WL_2m-1_{+1}$ and continues through to $WL_2m$. Thus data space 37 will not be selected unless the address bits corresponding to wordline $WL_2m-1_{+1}$ and higher are selected. But as explained above, when memory array 66 is being accessed internally by CPU 51 or externally accessed by serial means, then both data space 37 and code space 35 need to behave like two separate memory spaces. For example, in the present embodiment, data space 37 has 2K of storage locations and code space 35 has 8K of storage locations. If array 66 were being accessed externally by parallel means, then the entire array 66 would be addressed sequentially with addresses 0–8K corresponding to code space 35 and addresses 8K+1 to 10K corresponding to data space 37. But if memory array 66 were being accessed internally by CPU 51, then internal MOVX commands would be directed to addresses 0 to 2K of data space 37 and program fetches would be directed to address 0–8K of code space 35. To avoid address conflicts, CPU 51 issues a DATA_EN control signal indicating that it wants to access data space 37. This control signal takes-the place of the address bits which activate rows $WL_2m-1_{+1}$ to $WL_2m$.

If it is desired that memory array 66 be operated as an EEPROM, then the y address decoder will select a specific byte select line 85 for a desired byte address 81. But if the memory array is to be operated as a flash, i.e. the entire array is to be erased simultaneously, then all byte select lines 85 in the entire array 66 are simultaneously selected regardless of the addressed byte.

Figure 4:
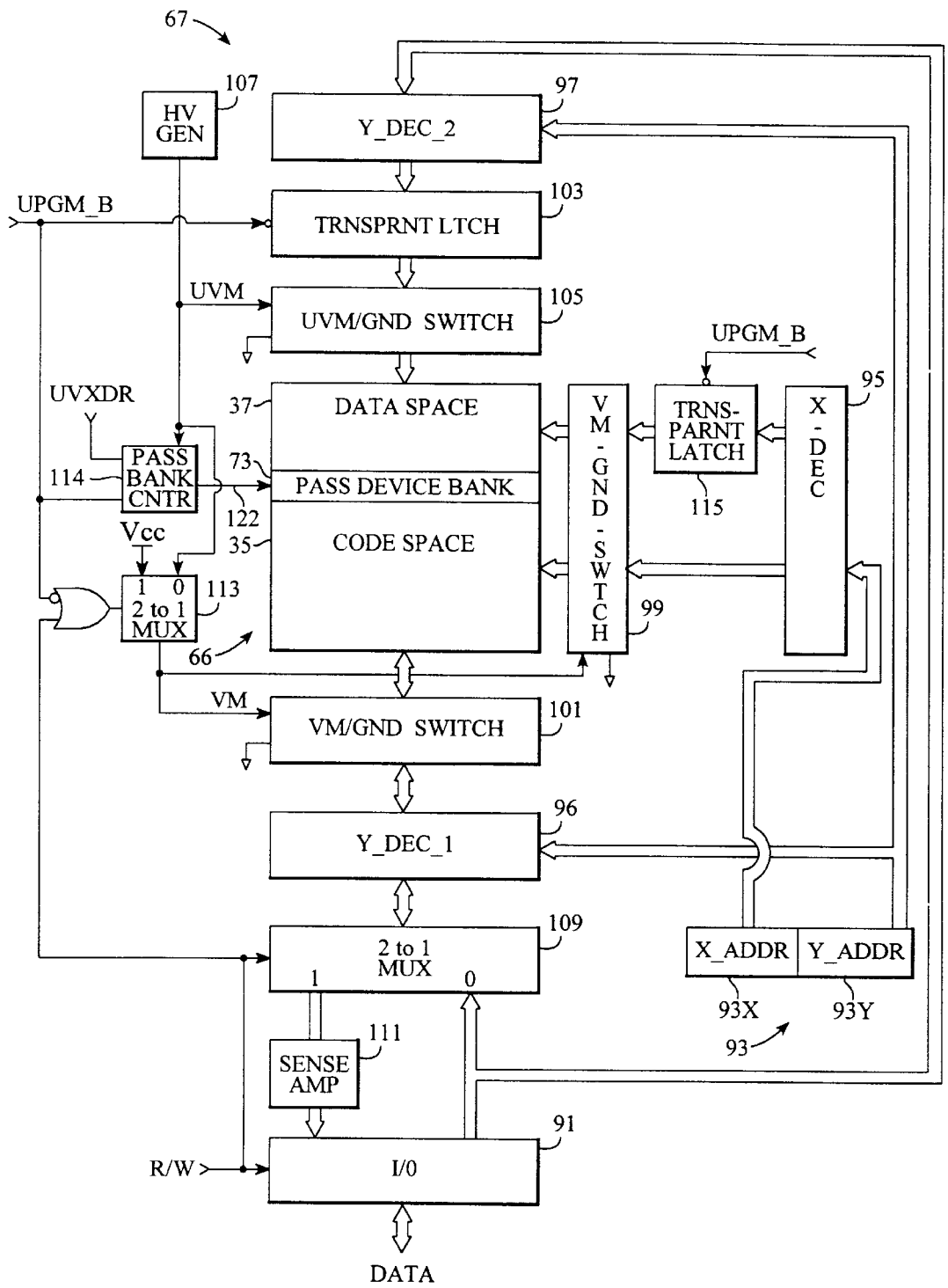
FIG. 4 is a block diagram of a first embodiment of the memory architecture in accord with the present invention.

With reference to FIG. 4, an architectural block diagram of a first embodiment of data/code memory 67 in accord with the present invention is shown. Main array 66 is again shown to consist of code space 35 and data space 37 divided by pass device bank 73. Data/code memory 67 supports writing to data space 37 while simultaneously reading from code space 35.

I/O box 91 controls the flow of data into and out of data/code memory 67 depending on whether data is being written into or read from main array 66. Address register 93 holds the location of the byte being addressed during the current operation. Address register 93 is divided into an x-address register 93x holding the location of a selected memory page and a y-address register 93y holding the location of a selected column of bytes. The intersection of the x-address and y-address identifies a selected byte within main array 66.

The data flow of a read operation without a simultaneous write operation causes code space 35 and data space 37 to be coupled together to form one contiguous array sharing common bit lines and byte select lines. This is done by setting pass device bank 73 to couple the bit lines and byte select lines of data space 37 with those of code space 35 in response to high signal on node 122. During a read operation, read/write signal R/W sets the path direction of I/O box 91 to output mode. Address register 93 holds the address of the byte being read and transfers the x-address 93x to x-decoder 95 and transfers the y-address 93y to a first y-decoder 96 and to a second y-decoder 97. Both y-decoders 96 and 97 select the same column lines identified by the y-address. X-decoder 95 places a logic 1 on a selected word line as determined by x-address 93x. The output of x-decoder 95 is supplied to a switch bank 99 which responds to a wordline having a logic 1 by placing voltage Vm on it and grounding all others. Voltage Vm during a read operation is set typically close to Vcc. Similarly, the first y-decoder 96 decodes the selected address and since switch box 101 is tri-stated during a read operation, the selected bitlines are transferred through 2-to-1 MUX 109 to sense amps 111. Both code space 35 and data space 37 share the same sense amps 111 since the select wordline can lie anywhere within array 66.

Second y-decoder 97 couples the selected column lines to transparent latch 103. Transparent latch 103 is responsive to signal UPGM_B, which maintains a logic low during simultaneous programming of data space 37 while reading from code space and 35 and maintains a logic high otherwise. If UPGM_B is high, then data is allowed to pass freely through transparent latch 103, and if UPGM_B is low, then transparent latch 103 responds by latching in the current contents at the output of second y-decoder 97. Since the present operation is a single read operation, signal UPGM_B is set to a logic high and transparent latch 103 freely transfer the output of second y-decoder 97 onto switch bank 105. Like in the previous case, switch bank 105 is tri-stated during a read operation and does not drive any of the bitlines so as to permit the selected bitline to be read by sense amps 111.

Sense amp 111 determines which of the selected bitlines are drawing current and which are not. Those which draw current are identified as a logic 0 and those that do not are identified as a logic 1. The identified logic signals are then transferred onto I/O box 91 to be driven out.

A single write operation without a concurrent read operation likewise treats array 66 as one contiguous memory space and the write operation may be performed anywhere within data space 37 and code space 35. In this case, read/write signal R/W alternates the function of I/O box 91 to receive input data and transfer it directly to second y-decoder 97 and transfer it indirectly through 2-to-1 mux 107 onto first y-decoder 96. Address register 93 again receives the address of the byte to be programmed and transfers the x-address 93x onto x-decoder 95. X-decoder 95 places an active high on the selected word line and switch bank 99 transfers the appropriate programming voltage from 2-to-1 mux 113 onto the selected word line.

Y-address 93y is transferred onto both first y-decoder 96 and second y-decoder 97. Since no concurrent read operation is taking place, signal UPGM_B is maintained high causing transparent latch 103 to again couple the results of second y-decoder 97 to switch bank 105. Likewise, the results of the first y-decoder 96 are coupled to switch bank 101. Thus, both switch banks 101 and 105 receive the input data and transfer it onto the selected bitlines. Switch bank 105 places voltage UVM from high voltage generator 107 onto the selected bitlines, and switch bank 101 places voltage VM onto the same selected bitlines. Voltage UVM comes from high voltage generator 107 which generates the appropriate voltages for a write operation and voltage VM comes from 2-to-1 mux 113. Since signal UPGM_B is high, 2-to-1 mux 113 becomes responsive to signal R/W and transfers the same voltage coming from high voltage generator 107 onto signal VM. Array 66 is thus driven simultaneously from both the top and bottom of the array.

In the case of simultaneous read and write operations, information is read from code space 35 while data is simultaneously written into data space 37. This operation begins by initiating a write instruction to data space 37 which begins the write sequence as explained above. However, if a write to data space 37 is initiated while reading from code space 35, signal UPGM_B will go low to indicate a simultaneous read and write operation and take control over 2-to-1 mux 113 so that voltage VM is supplied from Vcc and voltage VM will not receive the high programming voltage of UVM. If a read to code space 35 is initiated while data space 37 is still in the process of writing, then signal UPGM_B will again go low causing the data being output from the second y-decoder 97 to be latched by transparent latch 103 and maintained active at switch bank 105. Signal UVM maintains the appropriate programming voltage applied to switch bank 105. A logic low on signal UPGM_B also causes 2-1 MUX 113 to transfer Vcc onto signal Vm such that switch bank 101 will not experience any high programming voltages. Switch box 101, first y-decoders 96 and second y-decoder 97 then respond to the read operation in the typical manner explained above. The address of the data to be read within code space 35 is placed into address register 93 which transfers the appropriate x-address to x-decoder 95 and y-address to y-decoders 96 and 97.

Although the output from x-decoder 95 changes to reflect the new x address, signal UPGM_B maintains the appropriate word line within data space 37 activated by means of transparent latch 115. Thus, switch bank 99 will now have two word lines active simultaneously, a first word line within data space 37 as determined by transparent latch 115 and a second word line within code space 35 as determined by x decoder 95. In a similar manner, switch bank 101 will select a first set of bitlines as determined by first y-decoder 96 while switch bank 105 maintains an alternate set of bitlines as determined by transparent latch 103.

During this time, main array 66 is receiving two separate levels of voltages on two separate sets of bitlines. To prevent any interference between the programming of data space 37 and reading of code space 35, a logic low is placed at node 122 which deactivates pass device bank 73. The selected byte within code space 35 therefore transfers its data through first y-decoder 96 and 2-to-1 MUX 109 onto sense amps 111, which reads the selected byte and outputs the data onto I/O box 91. In this manner, multiple read operations can be executed from code space 35 while maintaining an active write operation to data space 37.

Transparent latches 103 and 115 have a similar structure, each receiving a decoder input line from their respective decoders 97 or 95 and each outputting a line onto their respective switch banks 105 or 99. With reference to FIG. 5, an example of a one-bit latch used in transparent latches 115 and 103 is shown. As will be understood, transparent latch banks 115 and 103 would consist of a plurality of these one-bit latches, with a latch corresponding to each line. An input line DEC_in from each respective address decoder is supplied to the input of inverter 132. The output of inverter 132 is transferred through pass device 134 onto latch 136. As shown, pass device 134 is controlled by signal UPGM_B. If signal UPGM_B is high, then the signal from inverter 132 will be transferred directly onto latch 136. Latch 136 consists of two cross-coupled inverters 140 and 138. The output of inverter 138 is then transferred through a second pass device 135 onto the output line. Inverter 132 initially inverts the logic signal of decoder input DEC_in, but inverter 138 then reciprocates the signal back to its initial state before placing it onto the output line. If the output line has a logic low then high voltage latch 142 will maintain it at ground potential, but if the output line has a logic high then high voltage latch 142 will raise the voltage on the output line up to its maximum voltage of UVM or Vm, depending on what its input voltage is. Second pass device 135 functions as an isolation gate to prevent the high voltage on the output line from driving latch 136. The gate 133 of pass device 135 is maintained at a nominal voltage close to Vcc and thereby prevents its electrode adjacent latch 136 from rising higher than Vcc. If signal UPGM_B goes low, then pass device 134 is turned off and whatever data was previously stored within latch 136 will be maintained latched and sustained as long as signal UPGM_B remains low.

With reference to FIG. 6, the internal structure of pass bank control 114 of FIG. 4 is shown. In FIG. 6, signal UPGM_B is coupled to pass device 124, which transmits the logic signal of UPGM_B onto node 122. As was stated earlier with reference to FIG. 4, node 122 controls whether pass device bank 73 isolates or couples data space 37 and code space 35. If pass device bank 73 is to couple data space 37 to code space 35, then it must receive a voltage on node 122 at least as high as the highest voltage which is placed on the column lines of data space 37 and code space 35. Therefore, high voltage latch 126 can raise the voltage at node 122 to appropriate levels for controlling pass device bank 73 of FIG. 4. The control gate of pass device 124 is maintained at about 4 volts by means of UVXDR to prevent any backward driving of signal UPGM_B by high voltage latch 126, which will transfer a voltage value of UVM when the logic level at node 122 is at logic high and will maintain a ground potential when the logic level at node 122 is low.

Thus, when signal UPGM_B is a logic high, indicating that no simultaneous read/write operations are taking place, then the voltage value at node 122 will follow that of the voltage level of signal UVM. If a reading operation is taking place, then signal UVM will have a voltage value of Vcc and so will node 122, but if a program or erase operation is taking place and the bitline is required to have a high voltage of 17 volts, then signal UVM, and thereby node 122, will likewise be raised up to 17 volts to make certain that pass device bank 73 can transfer the correct voltage from data space 37 to code space 35, and vice versa. If a simultaneous read/write operation is taking place then signal UPGM_B will have a logic low thereby causing the voltage at node 122 to be brought down to ground regardless of the value of signal UVM. The grounding potential at node 122 deactivates pass device bank 73 and essentially isolates data space 37 from code space 35.

With reference to FIG. 7 a partial layout of pass device bank 73 coupling one byte select line 85 and one byte 81 of bit lines 74 from data space 37 to code space 35 is shown. All elements previously described in FIGS. 3–6 are given similar reference characters and are described above. As shown, node 122 from FIG. 6 is applied to the control gates of all pass devices 128 in pass device bank 73. When node 122 is low, all of the pass devices 128 are turned off and pass device bank 73 effectively isolates data space 37 from code space 35. When node 122 is high, it will transmit a voltage from data space 37 to code space 35 and vice versa up to a maximum voltage potential determined by node 122. For example, if data bitline $74_T$ has a potential of 17 volts, then pass device 128 will require that node 122 also have a similar voltage of 17 volts in order for data bitline $74_T$ of data space 37 to transfer its voltage unattenuated onto code bitline $74_B$ of code space 35. As shown, pass device bank 73 also transfers the potentials from data byte select lines $85_T$ of data space 37 to code byte select lines $85_B$ of code space 35 and vice versa.

With reference to FIG. 8, the required voltage levels for bitlines, wordlines and byte select lines for various circuit operations will now be disclosed. All elements similar to those of FIG. 3 have been identified with similar reference characters and are described above. During a read operation, the control gate of floating gate device 77 receives a typical voltage value of about 0.2* Vcc applied by sense line 79. Sense line 79 in turn receives the required voltage via byte select transistor 83 and byte select line 85. Wordline 72 receives a voltage of about Vcc indicating that it is selected and thereby activates both byte select transistor 83 and cell select transistor 75. Floating gate device 77 is read via select transistor 75 and bitline 74, which is coupled to sense amps 111 on FIG. 4 and typically receives a nominal reading voltage of about 2 volts.

If floating gate transistor 77 has no charge stored in its floating gate, then it will have a low threshold voltage Vth and will respond to the potential at its control gate by conducting current through cell select transistor 75 and bitline 74. Sense amps 111 will then interpret the flow of current as a logic 0. If, on the other hand, floating gate transistor 77 does have charge stored in its floating gate, then its Vth will be higher than the read potential. Thus, when the read potential is applied to its control, it will conduct no current and sense amps 111 will interpret the lack of current flow as a logic 1.

To alter the threshold voltage, and thereby the data stored in floating gate transistor 77, charge is moved onto and out of its floating gate. To raise its threshold level, byte select line 85 is raised up to a high voltage of UVM set to a typical value of 17 volts. This requires that wordline 72 likewise be raised to 17 volts in order to permit byte select transistor 83 to transfer the 17 volts from byte select line 85 onto byte segment line 79 and onto the control gate of floating gate transistor 77. Concurrently, grounding line Vs is set to 0 volts and so is bitline 74. Thus, the drain and source of floating gate transistor 77 are both set to 0 volts while its control gate is set to 17 volts. This causes an electric field which moves electrons onto its floating gate through Nordheim tunneling thereby raising its threshold voltage much above Vcc. To remove charge off of floating gate transistor 77, byte select line 85 is brought down to ground while word line 72 rises up to 17 volts thus strongly activating both byte select transistor 83 and cell select transistor 75. Sense line 79 thereby grounds the control gate of transistor 77. Bitline 74 is raised to 17 volts while signal Vs is allowed to float and typically rises up to 8 volts. Charge is thereby removed off its control gate through Nordheim tunneling. This lowers its threshold voltage much below Vcc and permits current to flow through it during a read operation.

Figure 9:
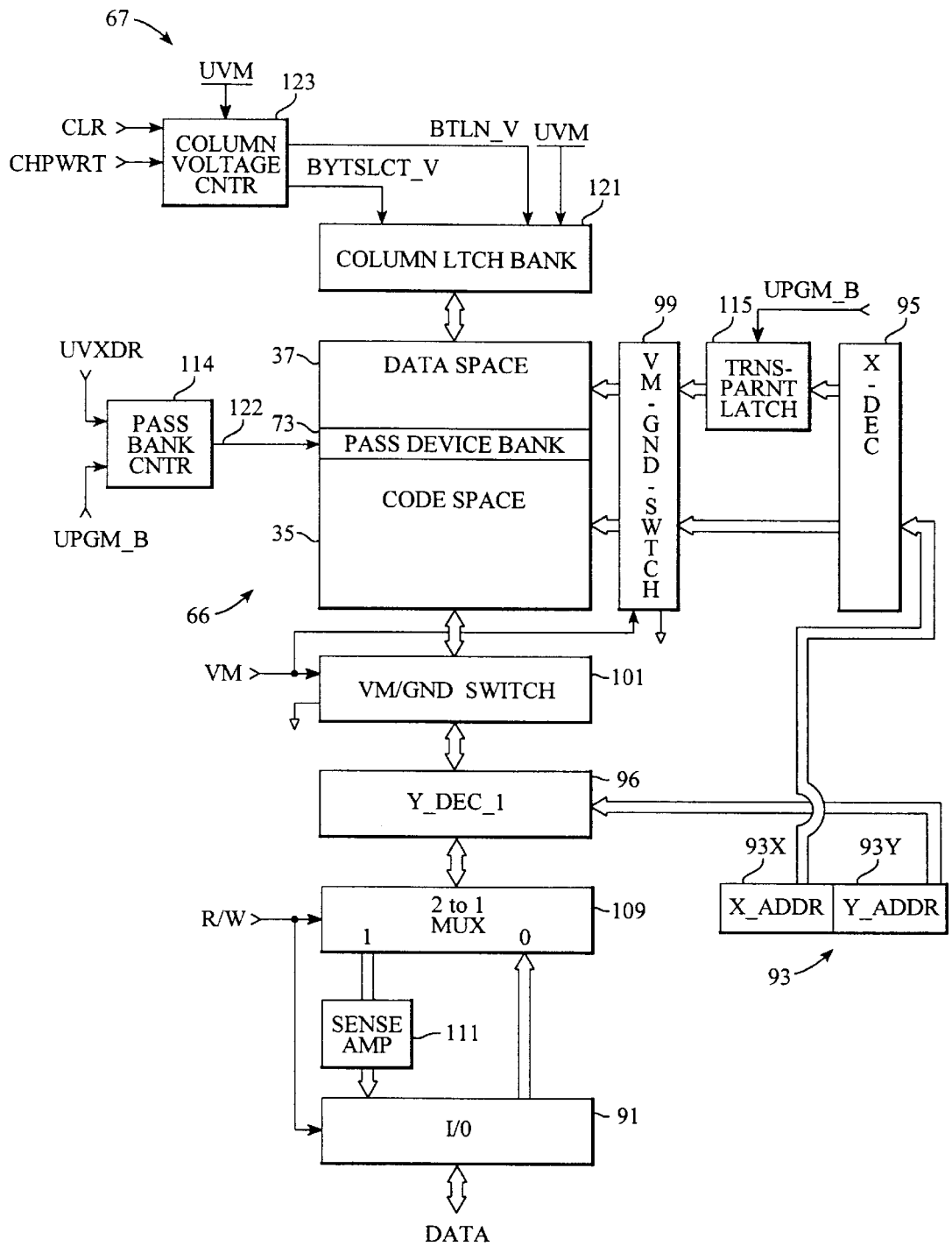
FIG. 9 is a block diagram of the second embodiment of a memory architecture in accord with the present invention.

With reference to FIG. 9, a second embodiment of memory 67 is shown. All elements in FIG. 9 similar to those in FIG. 4 are given the same reference characters and are described above. FIG. 9 differs from FIG. 4 mostly in that it uses a single y-decoder 96 in combination with a column latch bank 121 to control simultaneous reading of code space 35 while writing to data space 37.

In the absence of a concurrent read and write operation, the second embodiment of FIG. 9 performs a singular read operation or write operation in a manner similar to that disclosed in reference to FIG. 4. During a singular read operation, signal R/W sets 2-to-1 mux 109 to couple the output of y-decoder 96 to sense amps 111. The output of sense amps 111 are, in turn, coupled to I/O box 91, which outputs the data. The address of the current operation is stored in address register 93, with the x-address 93X being transferred to x-decoder 95 and the y-address 93Y being transferred to y-decoder 96. X-decoder 95 places a logic 1 on the selected wordline via switch box 99. The appropriate reading voltage applied by switch box 99 is determined by signal VM. As in the previous example of FIG. 4, switch box 101 is set to high impedance during a read operation and the selected bitlines are coupled directly to sense amps 111 via 2-to-1 mux 109.

During a singular program operation, signal R/W sets I/O box 91 to receive data and 2-to-1 mux 109 couples the input data to y-decoder 96. The address of the byte to be programmed is stored in address register 93, with the x-address 93X being coupled to x-decoder 95 and the y-address 93Y being coupled to y-decoder 96. The input data is transferred through switch box 101, through code space 35, through pass device bank 73 and through data space 37 to be finally stored in column latch bank 121. Multiple bytes of new data within a selected row may be written into column latch bank 121 such that column latch bank 121 can store up to one memory page of new data before an erase and program sequence is initiated. During this time, x-decoder 95 maintains the selected wordline active via switch bank 99.

Since this is a singular program operation, signal UPGM_B is maintain high and node 122 is maintained high. The voltage on node 122 is sufficient to transfer any high voltages between data space 37 and code space 35, as explained above. Once all the data to be written has been stored in column latch 121, then the appropriate erasing and programming voltage are applied to selected bytes, as determined by column latch bank 121. In other words, column latch bank 121 keeps track of which bytes within a selected memory page are to receive new data and which bytes are to be left alone. Only those bytes which are identified and scheduled to receive new data undergo an erase and program cycle.

During a concurrent read and write operation, transparent latch 115 responds to signal UPGM_B going low by latching in the currently selected wordline and maintaining it applied to data space 37 via switch bank 99. Meanwhile, x-decoder 95 responds to the new wordline being selected within code space 35 for the current read operation. Similarly, pass bank control 114 responds to UPGM_B being low by bringing low node 122, and thus deactivating pass device bank 73 and isolating data space 37 from code space 35. Column latch bank 121 maintains the appropriate erase and program voltages applied to selected bitlines while code space 35 is read through switch box 101 and y-decoder 96 to sense amps 111.

The use of column latch bank 121 simplifies the overall architecture. A column voltage control circuit 123 responsive to a clear signal CLR and a chip write signal CHPWRT generates two voltage outputs, BTLN_V for application on bitlines and BYTSLCT_V for application on byte select lines. The voltage values of BTLN_V and BYTSLCT_V are selected for proper erasing and programming of data space 37 and code space 35. When data is to be stored into array 66 either during a singular program operation or during a concurrent read/write operation, all the new data up to an entire memory page is first stored into column latch bank 121. Once all the intended new data has been written into column latch bank 121, it then responds by transferring the data in its latch banks into the appropriate memory page within either data space 71 or code space 69. Only those byte locations which receive new data undergo an initial erase cycle.

Figure 10:
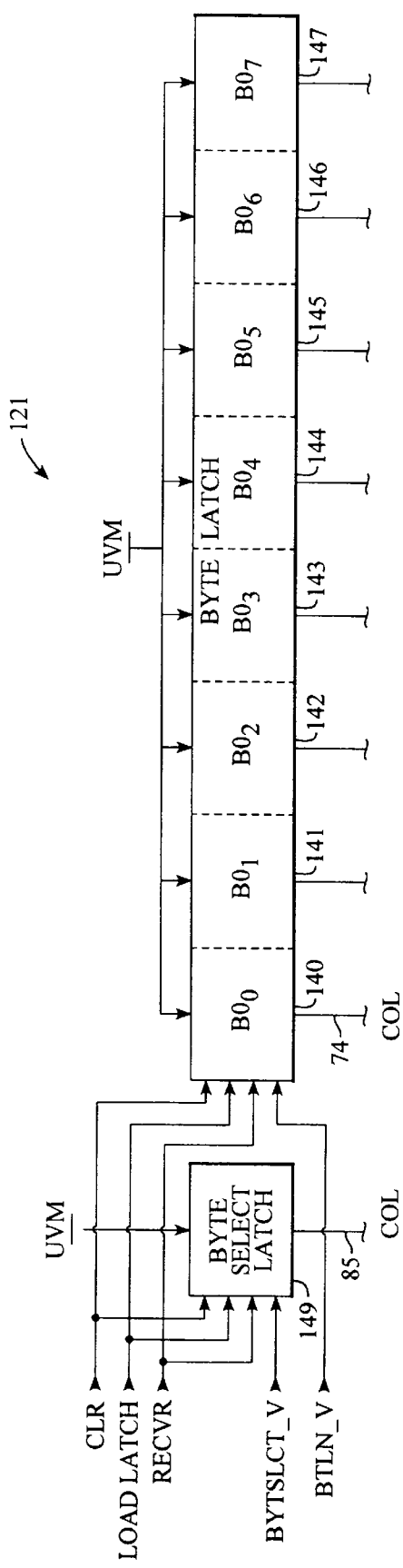
FIG. 10 is a partial layout of the column latch bank in accord with the present invention.

With reference to FIG. 10, a partial block diagram of column latch bank 121 for one byte of data is shown. Each byte select line 85 has its respective byte select latch 149 and each bitline 74 within one byte likewise has a respective individual latch 140 through 147. Both the byte select latches 149 and bitline latches 140–147 receive three control signals, CLR, Load Latch, and RECVR which together control the proper switching of voltages and timing required for read program and erase operations. The appropriate voltage levels are the same as those described with reference to FIG. 8 above. Byte select latch 149 further receives a BYTSLCT_V voltage which carries the appropriate voltage which should be applied to a byte select line 85. Signal BTLN_V carries the appropriate voltage applicable to bitlines 74 as required. If new data is written into any of bitline latches 140–147, the byte's respective byte select latch 149 will get a logic 1 stored in it. A logic 1 within byte select latch 149 indicates that its respective byte received new data and thereby targets the respective byte for an erase and program cycle. When a logic 1 or logic 0 is placed on a bitline 74 the appropriate bitline latches 140–147 store the placed logic 1 or 0 in preparation for a later programming sequence. A logic 1 in byte select latch 149 indicates that its associated byte has been altered. Only those bytes having a logic 1 on their byte select latch 149 undergo an erase and program sequence. When the programming sequence begins, those latches 140 through 147 which stored a logic 1 then program the appropriate byte as determined by the byte select line 85 and a selected word line. Both the byte select latch 149 and bitline latches 140 through 147 have similar structure differing only in the voltage level received, i.e. BTLN_V or BYTSLCT_V.

Figure 11:
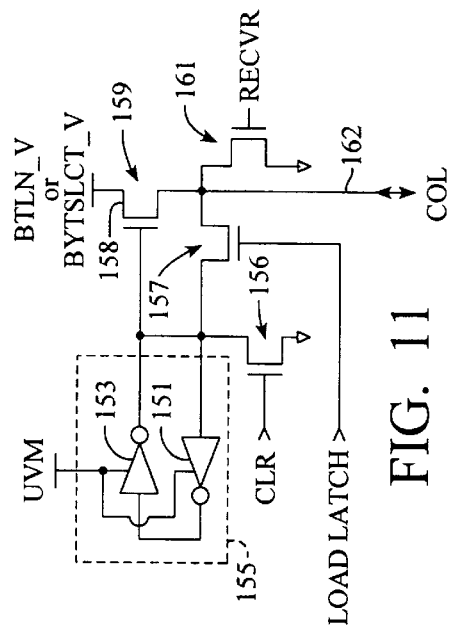
FIG. 11 is an internal view of an individual latch within the column latch bank of FIG. 10 in accord with the present invention.

With reference to FIG. 11, the internal structure of a latch for use as either byte select latch 149 or bitline latches 140 through 147 is shown. As seen in FIG. 11, whether the latch is used for byte select line 85 or bitline 74 will dictate which voltage value BTLN_V or BYTSLCT_V is applied to transistor 159, otherwise all control signals are the same. A column line 162, which may be either a byte select line 85 or bitline 74, is coupled to transistor 159. The control gate of transistor 159 is controlled by transistor 156 and by a latch 155, which consists of cross-coupled inverters 153 and 151. Inverters 153 and 151 receive their power supply voltage from signal UVM such that when a logic 1 is output, the logic high voltage level is that of UVM and when the logic low is output, the logic level is ground. When transistor 159 is active, as determined by transistor 156 or the two cross-coupled inverters 153 and 151, then the appropriate voltage level of either BYTSLCT_V or BTLN_V is transferred onto column line 162.

In operation, a column line 162 will initially have approximately ground potential. Similarly the output of latch 155 is initially cleared by means of signal CLR which activates transistor 156 and grounds the output of inverter 153 while simultaneously turning off transistor 159 and isolating column line 162 from the appropriate power voltage input BTLN_V or BYTSLCT_V. When the output of inverter 153 has been grounded, signal CLR is returned low thus turning off transistor 155 and allowing latch 155 to maintain ground potential applied to the control gate of transistor 159. The column latch thus initially has a stored logic 0 and is isolated from the bitline by virtue of transistor 159 being off.

If data is to be written into the latch, column line 162 will receive either a logic high or a logic low depending on whether a 1 or a 0 is to be written. Once a desired logic level has been placed in column line 162, signal Load Latch is actuated high causing transistor 157 to transfer the data from column line 162 onto the input of latch 155. If column line 162 has a logic low, then inverter 151 will respond by forcing inverter 153 to maintain a logic low on transistor 159 and thus keep it turned off. After a byte has been erased and the programming sequence begins, column line 162 will be essentially isolated from any programming voltages at drain 158 of transistor 159 the bit will retain its logic level unchanged. But if column line 162 has a logic high, then transistor 157 will transfer the logic high onto the input of inverter 151 and latch in the logic 1 at the output of inverter 153. A logic high at the output of inverter 153 causes transistor 159 to couple column line 162 to its appropriate voltage level, BTLN_V or BYTSLCT_V, at the drain 158 of transistor 159. When a programming or erasing sequence begins, drain 158 will receive the appropriate voltage levels which will in turn be transferred to column line 162 and thereby to a selected bit within a byte of memory array 66. In this manner, the data for an entire memory page can be first loaded into column latch bank 121, and then programmed at the same time into a row of memory array 66 in a single write cycle.

At the end of the programming or erase sequence, a recovery sequence is initiated to remove any stray voltages off the column lines, either bitlines or byte select lines. The recovery sequence places a logic high on signal RECVR which activates transistor 161 and grounds column line 162. Similarly, signal CLR is also pulled high thus activating transistor 156 and latching in a logic low at the output of inverter 153. This causes latch 155 to maintain a logic low at the control gate of transistor 159 and thereby isolate column line 162 from the voltage level at its drain 158. The latch is then ready to receive new data.

What is claimed is:

1. A microcontroller comprising:
   a control signal generator;
   a general purpose arithmetic logic unit, ALU, coupled to said control signal generator;
   first internal data memory responsive to said control signal generator for providing data between said ALU and said first internal data memory;
   means for accessing external data memory responsive to said control signal generator, said external memory being external to said microcontroller;
   a special function register responsive to said ALU and having a first control bit, said ALU being effective for selectively setting said first control bit to a first logic level and to a second logic level;
   a first address register responsive to an external data memory access command, MOVX, and not responsive to an internal memory access command; and
   routing means for applying the contents of said first address register to said means for accessing external data memory in response to said MOVX command in combination with said first control bit being at said first logic level, said routing means being further effecting for applying the contents of said first address register to said internal data memory in response to said MOVX in combination with said first control bit being at said second logic level.

2. The microcontroller of claim 1 further having a second internal data memory and a second address register coupled to said ALU, said second address register being responsive to said internal memory access command and not responsive to said MOVX command, said second address register being effective for addressing said second internal data memory in response to said internal data memory access command, said second address register having no access to said first internal data memory, said first internal data memory being non-responsive to said internal data memory access command.

3. The microcontroller of claim 2 wherein said first address register is an 16 bit register for accessing up to 65,536 memory locations and said second address register is an 8-bit register for accessing up to 256 data memory locations.

4. The microcontroller of claim 1 wherein said special function register includes a second control bit, said first control bit selectively directing read access instructions to one of said first internal data memory and said means for accessing external data memory, said second control bit selectively directing program access instructions to one of said first internal data memory and said means for accessing external data memory, whereby said first control bit can direct read instructions to one of internal and external data memories while said second control bit can simultaneously direct program instructions to the other one of said internal and external data memories.

5. The microcontroller of claims 1 wherein said special function register further has at least two timer control bits for selecting one of multiple distinct watchdog timer settings, each of said watchdog timer settings being effective for establishing a maximum non-activity time period during which if said microcontroller is inactive then said microcontroller will undergo a reset routine to bring all ALU registers to predetermined values.

6. The microcontroller of claim 5 wherein said special function register further includes a timer reset bit effective for restarting said maximum non-activity time period before said reset routine is instigated.

7. The microcontroller of claims 1 wherein said microcontroller further includes a first data pointer responsive to said ALU and a second data pointer responsive to said ALU, said first and second data pointers being effective for respectively storing a first and second data address location for quick access thereto, said first and second data pointers having substantially similar functionality as said first address register and having their contents selectively applied to one of said first internal data memory and said means for accessing external data memory by means of said MOVX command in combination with said first control bit, whereby the number of addressable data locations by said data pointers is effectively doubled.

8. The microcontroller of claim 1 wherein said first internal data memory constitutes data memory store within a single memory module, said single memory module further comprising a code memory store for storing executable instructions, said data memory store and said code memory store sharing a common set of sense amps, a common set of input/output drivers and a common set of bit lines, said common set of bitlines selectively coupling said data memory store to said code memory store;

said single memory module further having a bank of pass devices for selectively isolating said data memory store from said code memory store, said code memory store being continuously coupled to said single set of sense amps and to said single set of input/output drivers, said bank of pass devices selectively coupling said data memory store through said code memory store to said single set of sense amps and said single set of input/output drivers.

9. The microcontroller of claim 8 further having a power supply Vcc and a high voltage generating means for generating a program/erase voltage at least twice as high as said Vcc, said data memory sector being continuously coupled to said high voltage generating means, said bank of pass devices selectively coupling said code memory store through said data memory store to said high voltage generating means.

10. The microcontroller of claim 8 wherein said code memory store has a first program and erase cycling rating and said data memory store has a second program and erase cycling rating, said second program and erase cycling rating being at least 10 times higher than said first program and erase cycling rating.

11. The microcontroller of claim 10 wherein said first program and erases cycling rating is at most 1,000 and said second program and erase cycling rating is at least 100,000.

12. The microcontroller of claim 10 wherein said data memory store has 100% redundancy and said program data store has no redundancy.

13. The microcontroller of claim 8 wherein said single memory module subdivides a memory address into an x-address for identifying a wordline and an y-address for identifying a column of bitline;

said y-address being coupled to a first y-decoder for selecting a group of bitlines as determined by said y-address, said selected group of bitlines being coupled to said code memory store;

said x-address coupled to an x-decoder for selecting a wordline as determined by said x-address, wordlines corresponding to said code memory store being coupled directly to said code memory store and wordlines corresponding to said data memory store being coupled to said data memory store through an x-transparent latch, said x-transparent latch being effective for selectively latching the logic state of all wordlines coupled to said data memory store.

14. The microcontroller of claim 13 wherein said data memory store is separated from said code memory store in addressable space by a predetermined address bit in said x-address, whereby said data memory store is selected if said predetermined address bit is set;

said microcontroller further having a data space access control line coupled to said single memory module for selecting said data memory store while said predetermined address bit is not set, said data space access control line and said predetermined address bit being logically combined to select said data memory store when either of said predetermined address bit and said data space access control line is set.

15. The microcontroller of claim 13 wherein said single memory module further includes a voltage supply Vcc, a means for selectively generating a high voltage HV signal at least twice as high as Vcc, a second y-decoder coupled to receive said y-address, and a concurrent read/write line for instigating simultaneous writing to said data memory store while reading from said code memory store;

said HV signal being coupled to said second y-decoder for transferring said HV signal onto a byte of bitlines as determined by said y-address;

said single memory module further having a routing means coupled to receive said Vcc and said HV signal, said routing means selectively transferring one of said Vcc and said HV signal to said first y-decoder in response to said concurrent read/write line, said concurrent read/write line further being coupled to control said bank of pass devices to selectively isolate said data memory store from said code memory store.

16. The microcontroller of claim 15, wherein said internal memory further includes a y-transparent latch having its inputs coupled to the output of said second y-decoder and having its output selectively coupled to said data memory store, said y-transparent latch being effective for latching the logic state output from said second y-decoder and transferring said HV signal onto selected bitlines within said data memory store in response to said concurrent read/write line.

17. The microcontroller of claim 13 wherein said single memory module further includes a voltage supply Vcc, a means for selectively generating a high voltage HV signal at least twice as high as Vcc, a column latch bank coupled to receive all column lines running through said data memory store and said code memory store, and a concurrent read/write line for instigating simultaneous writing to said data memory store while reading from said code memory store;

said column latch bank having a latching means coupled to each column line and effective for storing the logic state of said column line, said HV signal being coupled to said column latch bank for transferring said HV signal onto selected column lines as determined by the logic state stored in each of said latching means;

said concurrent read/write line further being coupled to control said bank of pass devices to selectively isolate said data memory store from said code memory store.

18. The microcontroller of claim 17 wherein said data memory store and code memory store include columns of bitlines and columns of byte select lines;

said single memory module further having a column voltage control means for generating a first voltage output signal and a second voltage output signal, said first voltage output signal being selectively coupled to said columns of bitlines as determined by said column latch bank and said second voltage output signal being selectively coupled to said columns of byte select lines as determined by said column latch bank, said first and second voltage output signals being responsive to a CHPWRT line used to indicate when a program sequence is active.

19. A microcontroller comprising:

a control signal generator;

a general purpose arithmetic logic unit, ALU, coupled to said control signal generator;

internal data memory responsive to said control signal generator for providing data between said ALU and said internal memory;

a first address register for accessing said internal data memory and responsive to said ALU, said first address register having an addressing capacity smaller than the size of said internal data memory, said internal data memory including a first part and a second part, said first part having a size not greater than the addressing range of said first address register and said second part having a size not less than the addressing range of said first address register, said first address register having access only to said first part;

means for accessing external data memory responsive to said control signal;

a special function register responsive to said ALU and having a first control bit, said ALU being effective for selectively setting said first control bit to a first logic level and to a second logic level;

a second address register coupled to said means for accessing external data memory and effective for addressing external data memory in response to an external data memory access command, MOVX; and routing means responsive to said first control bit of said special function register and effecting for selectively redirecting the contents of said second address register from said means for accessing external data memory to said second part of said internal data memory during said MOVX command.

20. The microcontroller of claim 19 wherein said first address register is an 8-bit register for accessing up to 256 data memory locations and said second address register is an 16 bit register for accessing up to 65,536 memory locations.

21. The microcontroller of claim 19 wherein said special function register includes a second control bit, said first control bit selectively directing read access instructions to one of said means for accessing external data memory and said second part of said internal memory, said second control bit selectively directing program access instructions to one of said means for accessing external data memory and said second part of said internal memory, whereby said first control bit can direct read instructions to one of internal and external data memories while said second control bit can simultaneously direct program instructions to the other one of said internal and external data memories.

22. The microcontroller of claims 19 wherein said special function register further has at least two timer control bits for selecting one of multiple distinct watchdog timer settings, each of said watchdog timer settings being effective for establishing a maximum non-activity time period during which if said microcontroller is inactive then said microcontroller will undergo a reset routine to bring all ALU registers to predetermined values.

23. The microcontroller of claim 22 wherein said special function register further includes a timer reset bit effective for restarting said maximum non-activity time period before said reset routine is instigated.

24. The microcontroller of claims 19 wherein said microcontroller further includes a first data pointer responsive to said ALU and a second data pointer responsive to said ALU, said first and second data pointers being effective for respectively storing a first and second data address location for quick access thereto, said first and second data pointers having substantially similar functionality as said second address register and having their contents selectively applied to one of said means for accessing external data memory and said second part of said internal data memory by means of said MOVX command in combination with said first control bit, whereby the number of addressable data locations by said data pointers is effectively doubled.

25. The microcontroller of claim 19 wherein said first part of said internal data memory comprises an array of multi-bit volatile data registers and said second part of said internal data memory comprise a data memory store within a single non-volatile memory module, said single non-volatile memory module further including a code memory store distinct from said data memory store and effective for storing executable code instructions, said data memory store and said code memory store sharing a common set of sense amps, a common set of input/output drivers and a common set of bit lines;

said single non-volatile memory module further having a bank of pass devices for selectively coupling the bitlines in said data memory store to the bitline in said code memory store whereby said bank of pass devices may selectively isolate said data memory store from said code memory store, said code memory store being continuously coupled to said single set of sense amps and to said single set of input/output drivers, said bank of pass devices selectively coupling said data memory store through said code memory store to said single set of sense amps and said single set of input/output drivers.

26. The microcontroller of claim 25 wherein said single non-volatile memory module is one of an EEPROM and a Flash memory module.

27. The microcontroller of claim 25 further having a power supply Vcc and a high voltage generating means for selectively generating a program/erase voltage at least twice as high as said Vcc, said data memory sector being continuously coupled to said high voltage generating means, said bank of pass devices selectively coupling said code memory store through said data memory store to said high voltage generating means.

28. The microcontroller of claim 25 wherein said code memory store has a first program and erase cycling rating and said data memory store has a second program and erase cycling rating, said second program and erase cycling rating being at least 10 times higher than said first program and erase cycling rating.

29. The microcontroller of claim 28 wherein said first program and erases cycling rating is at most 1,000 and said second program and erase cycling rating is at least 100,000.

30. The microcontroller of claim 28 wherein said data memory store has 100% redundancy and said program data store has no redundancy.

31. The microcontroller of claim 25 wherein said single non-volatile memory module subdivides a memory address into an x-address for identifying a wordline and an y-address for identifying a column of bitline;

said y-address being coupled to a first y-decoder for selecting a group of bitlines as determined by said y-address, said selected group of bitlines being coupled to said code memory store;

said x-address coupled to an x-decoder for selecting a wordline as determined by said x-address, wordlines corresponding to said code memory store being coupled directly to said code memory store and wordlines corresponding to said data memory store being coupled to said data memory store through an x-transparent latch, said x-transparent latch being effective for selectively latching the logic state of all wordlines coupled to said data memory store.

32. The microcontroller of claim 31 wherein said data memory store is separated from said code memory store in addressable space by a predetermined address bit in said x-address, whereby said data memory store is selected if said predetermined address bit is set;

said microcontroller further having a data space access control line coupled to said single non-volatile memory module for selecting said data memory store while said predetermined address bit is not set, said data space access control line and said predetermined address bit being logically combined to select said data memory store when either of said predetermined address bit and said data space access control line is set.

33. The microcontroller of claim 31 wherein said single non-volatile memory module further includes a voltage supply Vcc, a means for selectively generating a high voltage HV signal at least twice as high as Vcc, a second y-decoder coupled to receive said y-address, and a concurrent read/write line for instigating simultaneous writing to said data memory store while reading from said code memory store;

said HV signal being coupled to said second y-decoder for transferring said HV signal onto a byte of bitlines as determined by said y-address;

said single non-volatile memory module further having a routing means coupled to receive said Vcc and said HV signal, said routing means selectively transferring one of said Vcc and said HV signal to said first y-decoder in response to said concurrent read/write line, said concurrent read/write line further being coupled to control said bank of pass devices to selectively isolate said data memory store from said code memory store.

34. The microcontroller of claim 33, wherein said internal memory further includes a y-transparent latch having its inputs coupled to the output of said second y-decoder and having its output selectively coupled to said data memory store, said y-transparent latch being effective for latching the logic state output from said second y-decoder and transferring said HV signal onto selected bitlines within said data memory store in response to said concurrent read/write line.

35. The microcontroller of claim 31 wherein said single non-volatile memory module further includes a voltage supply Vcc, a means for selectively generating a high voltage HV signal at least twice as high as Vcc, a column latch bank coupled to receive all column lines running through said data memory store and said code memory store, and a concurrent read/write line for instigating simultaneous writing to said data memory store while reading from said code memory store;

said column latch bank having a latching means coupled to each column line and effective for storing the logic state of said column line, said HV signal being coupled to said column latch bank for transferring said HV signal onto selected column lines as determined by the logic state stored in each of said latching means;

said concurrent read/write line further being coupled to control said bank of pass devices to selectively isolate said data memory store from said code memory store.

36. The microcontroller of claim 35 wherein said data memory store and code memory store include columns of bitlines and columns of byte select lines;

said single non-volatile memory module further having a column voltage control means for generating a first voltage output signal and a second voltage output signal, said first voltage output signal being selectively coupled to said columns of bitlines as determined by said column latch bank and said second voltage output signal being selectively coupled to said columns of byte select lines as determined by said column latch bank, said first and second voltage output signals being responsive to a CHPWRT line used to indicate when a program sequence is active.

37. A microcontroller comprising:

an internal memory;

an external parallel access means for externally accessing said internal memory, said external parallel access means being effective for externally programming and reading said internal memory;

an external serial access means for accessing said internal memory, said external serial access means being effective for externally programming and reading said internal memory;

a locking fuse accessible only through said external parallel access means and effective for selectively preventing programming of said internal memory through said external serial access means.

38. The microcontroller of claim 37 wherein said internal memory comprises a data memory store and a code memory store, said locking fuse being effective for preventing serial programming of said code memory store and not effective for limiting serial programming to said data memory store.

39. A microcontroller comprising:

an internal code memory for storing program instructions;

means for accessing external code memory storing additional program instructions;

a general purpose arithmetic logic unit, ALU, effective for executing said program instructions;

a program counter register for holding the address of the next program instruction to be executed;

monitoring means for determining if the address held in said program counter register lies within said internal code memory;

routing means responsive to said monitoring means, said routing means being effective for applying the address held in said program counter to said internal code memory if said address lies within said internal code memory, and further effective for applying said address to said means for accessing external code memory if said address does not lie within said internal memory;

a special function register responsive to said ALU and having a first control bit, said ALU being effective for selectively setting said first control bit to a first logic level and to a second logic level; and routing means responsive to said first control bit of said special function register and effecting for selectively redirecting the address held in said program counter register from said internal code memory to said means for accessing external code memory regardless of whether said address lies within said internal code memory.

40. A non-volatile re-programmable memory system for storing both code memory and data memory and for use with a microcontroller comprising:

a single memory array having a single set of sense amps, a single set of input/output drivers, a single set of bitlines and an x-decoder for selecting a single wordline within said memory array, said memory array being divided into a code memory store and a data memory store, said single set of bitlines traversing both of said code memory store and said data memory store, said code memory store having a first program and erase cycling rating and said data memory store having a second program and erase cycling rating, said second program and erase cycling rating be at least 10 times greater than said first program and erase cycling rating;

a bank of pass devices selectively isolating said data memory store from said code memory store, said code memory store being coupled to said single set of sense amps and to said single set of input/output drivers, said bank of pass devices being selectively coupled to said data memory store through said code memory store to said single set of sense amps and said single set of input/output drivers.

41. The re-programmable memory system of claim 40 wherein said first program and erases cycling rating is at most 1,000 and said second program and erase cycling rating is at least 100,000.

42. The re-programmable memory system of claim 40 wherein said data memory store has 100% redundancy and said program data store has no redundancy.

43. The re-programmable memory system of claim 40 further including an address register for holding the address location of a currently accessed memory location, said address register subdividing said address location into an x-address for identifying a wordline and an y-address for identifying a column of bitlines, said y-address coupled to a first y-decoder for selecting a group of bitlines as determined by said y-address, said selected bitlines being coupled to said code memory store;

said x-address coupled to an x-decoder for selecting a wordline as determined by said x-address, wordlines corresponding to said code memory store being directly coupled to said code memory store and wordlines corresponding to said data memory store being indirectly coupled to data memory store through an x-transparent latch, said x-transparent latch being effective for selectively latching the logic state of all wordlines corresponding to said data memory store.

44. The re-programmable memory system of claim 43 further having a data store enable line for selecting said data memory store;

said data memory store further being separated from said code memory store in addressable space by a predetermined address bit in said x-address whereby said data memory store is selected if said predetermined address bit is set;

said data store enable line further being effective for selecting said data memory space while said predetermined address bit is not set, said data store enable line and said predetermined address bit being logically combined to select said data memory store when either of said predetermined address bit and said data store enable line is set.

45. The re-programmable memory system of claim 43 further including a voltage supply Vcc, a means for selectively generating a high voltage HV signal at least twice as high as Vcc, a second y-decoder coupled to receive said y-address, and a concurrent read/write line for instigating simultaneous writing to said data memory store while reading from said code memory store;

said HV signal being coupled to said second y-decoder for transferring said HV signal onto a selected column of bitlines as determined by said y-address;

said memory system further having a routing means coupled to receive said Vcc and said HV signal, said routing means selectively transferring one of said Vcc and said HV signal to said first y-decoder in response to said concurrent read/write line, said current read/write line further being coupled to control said bank of pass devices to selectively isolate said data memory store from said code memory store.

46. The re-programmable memory system of claim 45 further including a y-transparent latch having its inputs coupled to the output of said second y-decoder and having its output selectively coupled to said data memory store, said y-transparent latch being effective for latching the existing output from said y-decoder and transferring said HV signal onto selected bitlines within said data memory store in response to said concurrent read/write line.

47. The re-programmable memory system of claim 43 further including a voltage supply Vcc, a means for selectively generating a high voltage HV signal at least twice as high as Vcc, a column latch bank coupled to receive all column lines from said data memory store and said code memory store, and a concurrent read/write line for instigating simultaneous writing to said data memory store while reading from said code memory store;

said column latch bank having a latching means coupled to each column line and effective for storing a logic state of said column line, said HV signal being coupled to said column latch bank for transferring said HV signal onto a selected bitlines as determined by the logic state current stored in said column latch bank for each bitline;

said current read/write line further being coupled to control said bank of pass devices to selectively isolate said data memory store from said code memory store.

48. The re-programmable memory system of claim 47 wherein said data memory store and code memory store include columns of bitlines and columns of byte select lines;

said memory system further having a column voltage control means for generating a first voltage output signal and a second voltage output signal, said first voltage output signal being selectively coupled to said columns of bitlines as determined by said column latch bank and said second voltage output signal being selectively coupled to said columns of byte select lines as determined by said column latch bank, said first and second voltage output signals being responsive to a CHPWRT line used to indicate when a program sequence is active.

* * * * *